US008691404B2

(12) United States Patent
Kwon et al.

(10) Patent No.: US 8,691,404 B2
(45) Date of Patent: Apr. 8, 2014

(54) HIGH ENERGY-DENSITY RADIOISOTOPE MICRO POWER SOURCES

(75) Inventors: Jae Wan Kwon, Columbia, MO (US); Tongtawee Wacharasindhu, Columbia, MO (US); John David Robertson, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 1002 days.

(21) Appl. No.: 12/723,370

(22) Filed: Mar. 12, 2010

(65) Prior Publication Data

US 2010/0233518 A1 Sep. 16, 2010

Related U.S. Application Data

(60) Provisional application No. 61/209,954, filed on Mar. 12, 2009.

(51) Int. Cl.

| | |
|---|---|
| ***H01M 14/00*** | (2006.01) |
| ***H01L 21/20*** | (2006.01) |
| ***H01L 21/00*** | (2006.01) |
| ***H01L 21/36*** | (2006.01) |
| ***H01L 31/00*** | (2006.01) |

(52) U.S. Cl.
USPC ............... 429/7; 438/381; 438/482; 438/500; 438/507; 438/36; 136/253

(58) Field of Classification Search
USPC ..................... 29/623.1–623.5, 825, 730, 763; 136/250–259; 429/11, 7, 479–497, 429/507–511, 535; 257/40, 429, E21.002, 257/E21.003, E21.158; 438/381, 141–142, 438/378, 308, 474, 512, 795, 84, 89, 93, 95, 438/96, 482, 483, 537, 557; 376/100–400; 264/1.21–3.6; 310/301–305; 977/854
See application file for complete search history.

(56) References Cited

U.S. PATENT DOCUMENTS

| | | | | |
|---|---|---|---|---|
| 4,889,777 A * | 12/1989 | Akuto | ........................... | 429/162 |
| 5,230,712 A * | 7/1993 | Matthews | .................... | 29/25.03 |
| 7,193,237 B2 | 3/2007 | Aramaki et al. | | |
| 7,491,881 B2 * | 2/2009 | Putnam | ......................... | 136/253 |
| 2006/0034415 A1 * | 2/2006 | Tsang et al. | .................. | 376/320 |

OTHER PUBLICATIONS

Liquid Metals and Liquid Semiconductors, Author: Friedrich Hensel, Angew. chem. Int. Ed. Engl. 19, pp. 593-606 (1980).

(Continued)

*Primary Examiner* — Patrick Ryan
*Assistant Examiner* — Kiran Quraishi
(74) *Attorney, Agent, or Firm* — Polster, Lieder, Woodruff & Lucchesi, LC

(57) ABSTRACT

A method of constructing a solid-state energy-density micro radioisotope power source device. In such embodiments, the method comprises depositing the pre-voltaic semiconductor composition, comprising a semiconductor material and a radioisotope material, into a micro chamber formed within a power source device body. The method additionally includes heating the body to a temperature at which the pre-voltaic semiconductor composition will liquefy within the micro chamber to provide a liquid state composite mixture. Furthermore, the method includes cooling the body and liquid state composite mixture such that liquid state composite mixture solidifies to provide a solid-state composite voltaic semiconductor, thereby providing a solid-state high energy-density micro radioisotope power source device.

11 Claims, 11 Drawing Sheets

(56) References Cited

OTHER PUBLICATIONS

Relation between barrier heights and work function in contacts to selenium, C.H. Champness and A. Chan, Electrical Engineering Dept., McGill University, Downloaded Mar. 12, 2010 o 161.130.197.88. Redistribution subject to AIP license or copyriht; see http://jap.aip.org/jap/copyright.jsp.

IOP Science, Electronic surface properties of a liquid semiconductor: selenium, 1985 J. Phys. C: Solid State Phys. 18 2527, downloaded Mar. 12, 2010, available at: http://iopscience.iop.org/0022-3719/18/12/014.

* cited by examiner

| REFERENCE | [5] | [9] | [10] | [11] | OUR DEVICE |
|---|---|---|---|---|---|
| DEVICE | BETACEL (MODEL 50) | SCHOTTKY BETAVOLTAIC | PROMETHIUM-147 ATOMIC BATTERY | BETABATT INC | ENCAPSULATED BETAVOLTAIC |
| STRUCTURE | SILICON P/N | SILICON/GOLD SCHOTTKY | SILICON P/N | POROUS SILICON P/N | SELENIUM/ALUMINUM SCHOTTKY |
| SOURCE | Pm147 (12ci) | Pm147 (26.4ci) | Pm147 (6.8ci) | TRITIUM $^3H$ (0.11ci) | SULFUR $^{35}S$ (10.89ci) |
| ENERGY MAX | 224 keV | 224 keV | 224 keV | 18.6 keV | 167keV |
| POWER | 50μw | 8.7μw | 9μw | 8.3nW | 76.53nW |
| OVERALL EFFICIENCY | 1.0% | 0.09% | 0.77% | 0.22% | 2.42% |
| TOTAL SCALE DEVICE | H=1.02cm D=1.52cm | H=1.27cm D=2.54cm | N/A | H=1.27cm D=2.54cm | H=0.2cm W=2.43cm $L_{BOTTOM}$=3.81cm $L_{COVER}$=2.54cm |
| RADIATION DOSE | AT SURFACE ~50mrem/hr | AT SURFACE 9 mrem/hr | N/A | N/A | LESS THAN 1mrem/hr |
| TOTAL VOLUME($cm^3$) | 1.85 $cm^3$ | 6.31$cm^3$ | LESS THAN 32.7 $cm^3$ | LESS THAN 41.45$cm^3$ | 1.93$cm^3$ |
| NORMALIZED POWER WITH 10ci (μW) | 41.58 | 3.28 | 13.25 | 0.74 | 70.27 |
| ESTIMATED POWER DENSITY WITH 10ci (μW/$cm^3$) | 22.48 | 0.52 | 0.40 | 0.18 | 36.41 |

FIG. 9

HIGH ENERGY-DENSITY RADIOISOTOPE MICRO POWER SOURCES

CROSS-REFERENCE TO RELATED APPLICATIONS

This application claims the benefit of U.S. Provisional Application No. 61/209,954, filed on Mar. 12, 2009, which is hereby incorporated by reference in its entirety.

FIELD

The present teachings relate to high energy-density radioisotope micro power sources, such as micro size batteries, for use in micro electro mechanical systems.

BACKGROUND

The statements in this section merely provide background information related to the present disclosure and may not constitute prior art.

Large, weighty batteries have been significant obstacles to realizing the full potential of various miniaturized electrical and mechanical devices developed in the recent, remarkable growth of micro/nanotechnology. Micro electro mechanical systems (MEMS) devices have been developed for use as various sensors and actuators; as biomedical devices; as wireless communication systems; and as micro chemical analysis systems. The ability to employ these systems as portable, stand-alone devices in both normal and extreme environments depends, however, upon the development of power sources compatible with the MEMS technology. In the worst case, the power source is rapidly depleted and the system requires frequent recharge for continuous, long-life operation.

A significant amount of research has been devoted to the development of higher energy density, light weight power sources. For example, solar cells can be used to provide electrical power for MEMS. Micro fuel cells have also been developed for many applications and a micro combustion engine has been reported. One of the major disadvantages of using chemical-reaction-based power sources is that the power density of the fuels gets lower as the size of the systems is reduced. A second major challenge is that the performance of these systems drops significantly when they are designed to achieve longer lives. In such cases, refueling (or recharging) is not a viable option because it cannot be done easily in tiny, portable devices. And finally, the aforementioned power sources cannot be used in extreme environments because either the reaction rate is influenced by temperature, and/or there is no sunlight available for powering the device.

Known radioisotope power sources were introduced in late 1950s. The concept of such direction conversion methods (alphavoltalics and betavoltaics) utilizes energy from radioactive decay. The radioisotope material emits $\alpha$ or $\beta$ particles, which are coupled to a rectifying junction like a semiconductor p-n junction (or diode). The particles propagate to the rectifying junction and produce electron-hole pairs (EHPs). The EHPs are separated by the rectifying junction and converted into electrical energy.

Known crystalline solid-state semiconductors such as silicon carbides (SiC) or silicon based semiconductors have been formerly used for low energy beta voltaic cells using the rectifying junctions. However, one of the major drawbacks to using such known solid-state betavoltaic converters is that the ionizing radiation degrades the efficiency, performance, and lifetime of the conversion device. The primary degradation mechanism is the production of charge carrier traps from lattice displacement damage over the periods of time. Similarly but more seriously, high energy alpha particles can cause severe damage to the rectifying junctions of the solid-state semiconductors.

SUMMARY

The present disclosure relates to high energy-density radioisotope micro power sources, such as micro size batteries, for use in micro electro mechanical systems.

In various embodiments, the present disclosure provides a method of constructing an amorphous, i.e., not crystalline, solid-state high energy-density micro radioisotope power source device. In such embodiments, the method comprises depositing the pre-voltaic semiconductor composition, comprising a semiconductor material and a radioisotope material, into a micro chamber formed within a body of a high energy-density micro radioisotope power source device. The method additionally includes heating the body to a temperature at which the pre-voltaic semiconductor composition will liquefy within the micro chamber to provide a liquid state composite mixture. Furthermore, the method includes cooling the body and liquid state composite mixture such that liquid state composite mixture solidifies to provide a solid-state composite voltaic semiconductor, thereby providing a solid-state high energy-density micro radioisotope power source device.

In various other embodiments, the present disclosure provides a method of constructing an amorphous solid-state high energy-density micro radioisotope power source device, wherein the method comprises combining at least one semiconductor material with at least one radioisotope material and at least one dopant to provide a pre-voltaic semiconductor composition. The method additionally includes depositing the pre-voltaic semiconductor composition into a micro chamber formed in a bottom portion of a high energy-density micro radioisotope power source device. The bottom portion of the high energy-density micro radioisotope power source device includes a first electrode disposed in a bottom of the micro chamber. The method further includes disposing a top portion of the high energy-density micro radioisotope power source device onto the bottom portion of the high energy-density micro radioisotope power source device, thereby covering the micro chamber and providing an assembled body of the high energy-density micro radioisotope power source device. The top portion of the high energy-density micro radioisotope power source device includes a second electrode disposed at a top of the micro chamber.

Still further, the method includes heating the assembled body to a temperature at which the pre-voltaic semiconductor composition will liquefy within the micro chamber such that the at least one semiconductor material, at least one radioisotope material and at least one dopant are thoroughly and uniformly mixed to provide a liquid state composite mixture. The method still yet further includes applying a compression bonding process to the heated assembled body to form a 'leak-proof' seal between the top and bottom portions of the high energy-density micro radioisotope power source device. Furthermore, the method includes cooling the assembled body and liquid state composite mixture such that liquid state composite mixture solidifies to provide a solid-state composite voltaic semiconductor, and thereby providing a solid-state high energy-density micro radioisotope power source device.

In yet other embodiments, the present disclosure provides a solid-state high energy-density micro radioisotope power source device. In such embodiments, the device includes a dielectric and radiation shielding body having an internal cavity formed therein. The device additionally includes a first electrode disposed a first end of the cavity, and a second electrode disposed at an opposing second end of the cavity and spaced apart from the first electrode such that a micro chamber is provided therebetween. The device further includes a solid-state composite voltaic semiconductor disposed within the micro chamber between and in contact with the first and second electrodes. The solid-state composite voltaic semiconductor fabricated by (1) combining at least one semiconductor material with at least one radioisotope material to provide a pre-voltaic semiconductor composition; (2) depositing the pre-voltaic semiconductor composition into the micro chamber; (3) heating the body to a temperature at which the pre-voltaic semiconductor composition will liquefy within the micro chamber such that the at least one semiconductor material and at least one radioisotope material are thoroughly and uniformly mixed to provide a liquid state composite mixture; and (4) cooling the body and liquid state composite mixture such that liquid state composite mixture solidifies to provide the solid-state composite voltaic semiconductor.

Further areas of applicability of the present teachings will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

FIG. 9 is a table illustrating a comparison of various known betavoltaic device with respect to exemplary test data results produced by the high energy-density micro radioisotope power source device, shown in FIG. 1, in accordance with various embodiments of the present disclosure.

Corresponding reference numerals indicate corresponding parts throughout the several views of drawings.

DETAILED DESCRIPTION

Figure 1A:
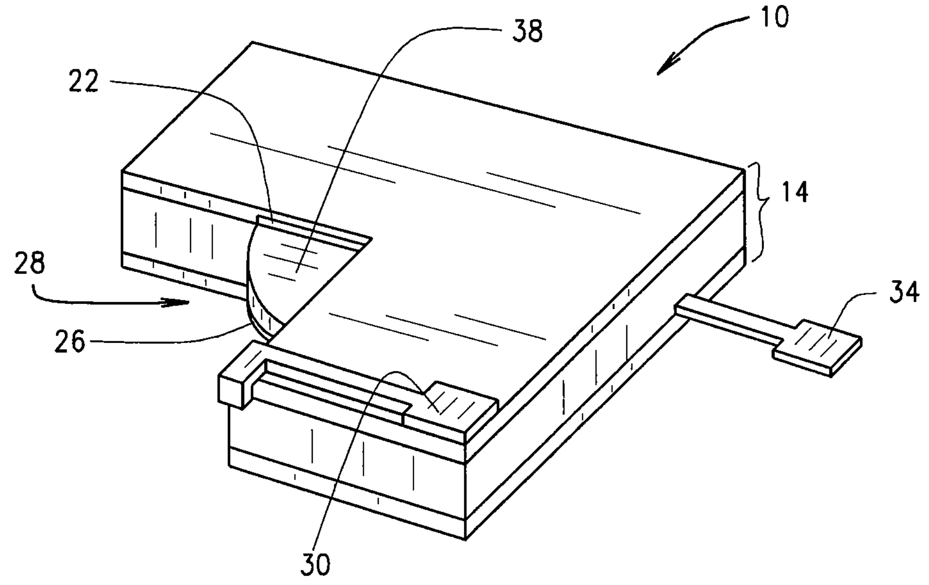
FIG. 1A is an isometric view of a high energy-density micro radioisotope power source device for use in micro electro mechanical systems, in accordance with various embodiments of the present disclosure.

The following description is merely exemplary in nature and is in no way intended to limit the present teachings, application, or uses. Throughout this specification, like reference numerals will be used to refer to like elements.

Figure 1B:
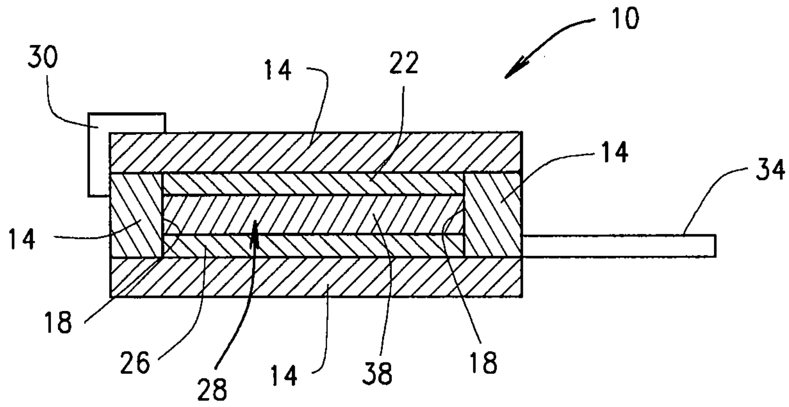
FIG. 1B is a cross-sectional view of the high energy-density micro radioisotope power source device, shown in FIG. 1A, in accordance with various embodiments of the present disclosure.

Referring to FIGS. 1A and 1B, a high energy-density micro radioisotope power source device 10 is provided for use in micro electro mechanical systems (MEMS). As described herein, the micro radioisotope power source device 10 provides a semiconductor voltaic cell in which the radioisotope material is integrated into the semiconductor material, whereby the integrated semiconductor can absorb radioactive energy, such as alpha radiation, beta radiation, or even fission fragments, to generate electron-hole pairs (EHPs).

Generally, the micro power source device 10 includes a dielectric and radiation shielding body 14 having an internal cavity 18 formed therein. Disposed at one end of the cavity 18 is an ohmic contact layer, or electrode, 22 and disposed at the opposing end of the cavity is a rectifying contact layer 26, or electrode, e.g., a Schottky contact layer. The ohmic contact layer 22 and rectifying contact layer 26 are spaced apart a selected distance, thereby defining a micro chamber 28. The internal cavity 18 can have any dimensions and volume necessary to provide the micro chamber 28 of any desired size and volume. The ohmic contact layer includes an ohmic lead 30 disposed on and/or extending from an exterior surface of the body 14. The rectifying contact layer 26 includes a rectifying lead 34 disposed on or extending from an exterior surface of the body 14. The micro power source device 10 additionally includes a solid-state composite voltaic semiconductor 38 disposed within the micro chamber 28, between and in contact with the ohmic contact layer 22 and the rectifying layer 34.

The ohmic contact layer 22 can comprise any suitable electrically conductive material. For example, in various embodiments, the ohmic contact layer 22 comprises nickel. The rectifying contact layer 26 can comprise any suitable electrically conductive material, for example, in various embodiments the rectifying contact layer 26 comprises aluminum. The voltaic semiconductor 38 is a composite comprising one or more semiconductor materials integrated with one or more radioisotope materials. In various embodiments, the voltaic semiconductor 38 can further include one or more dopants, i.e., impurities or doping materials, such as phosphorous, boron, carbon, etc. The one or more dopants can be employed to control various behavioral characteristics of the micro power source device 10. In various embodiments, the voltaic semiconductor 38 can comprise the semiconductor material Selenium (Se) integrated with the radioisotope material Sulfur-35 ($^{35}S$) and the dopant phosphorous.

Figure 2A:
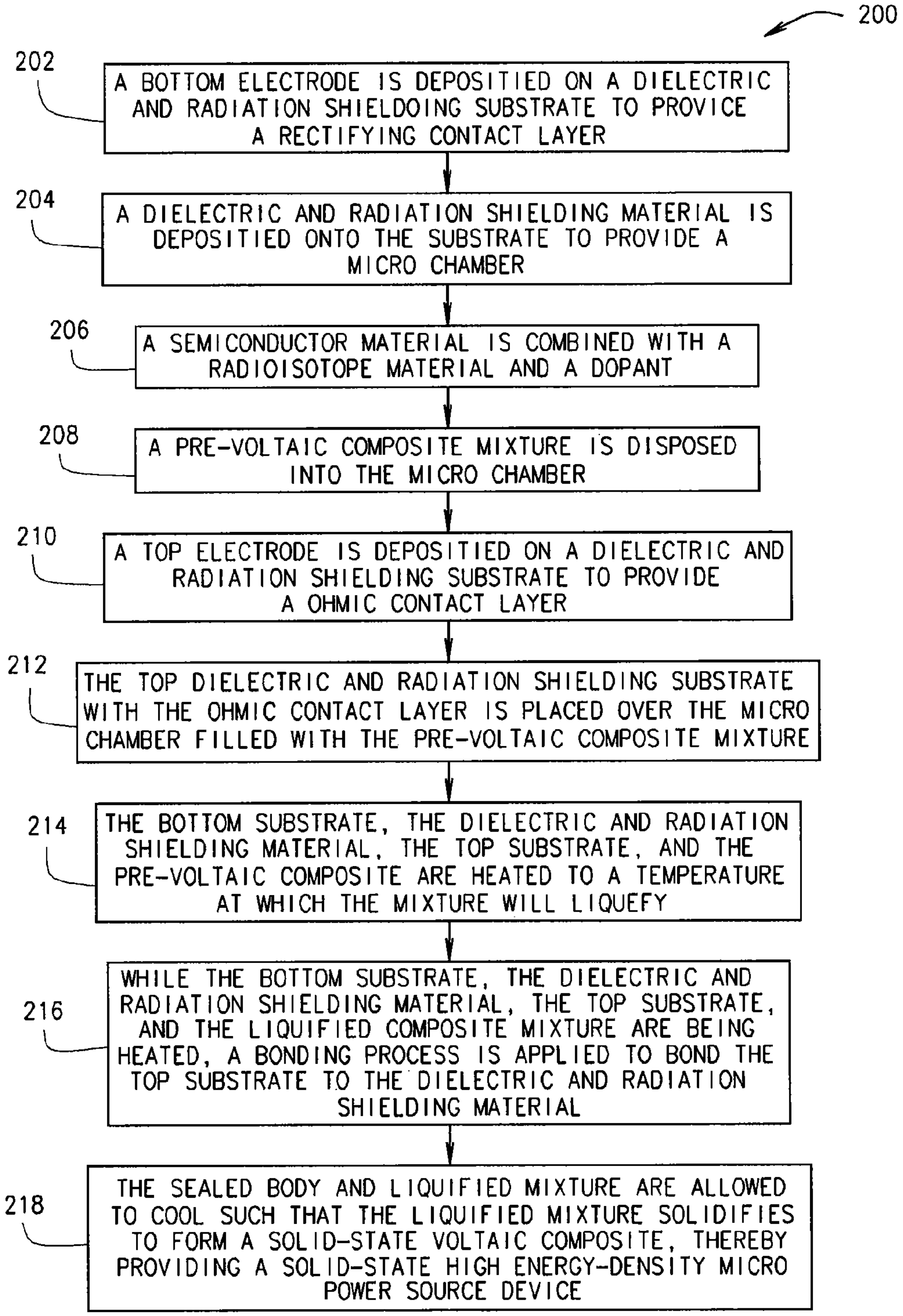
FIG. 2A is a flow diagram illustrating an exemplary fabrication process of the micro radioisotope power source device shown in FIGS. 1A and 1B, in accordance with various embodiments of the present disclosure.
Figure 2B:
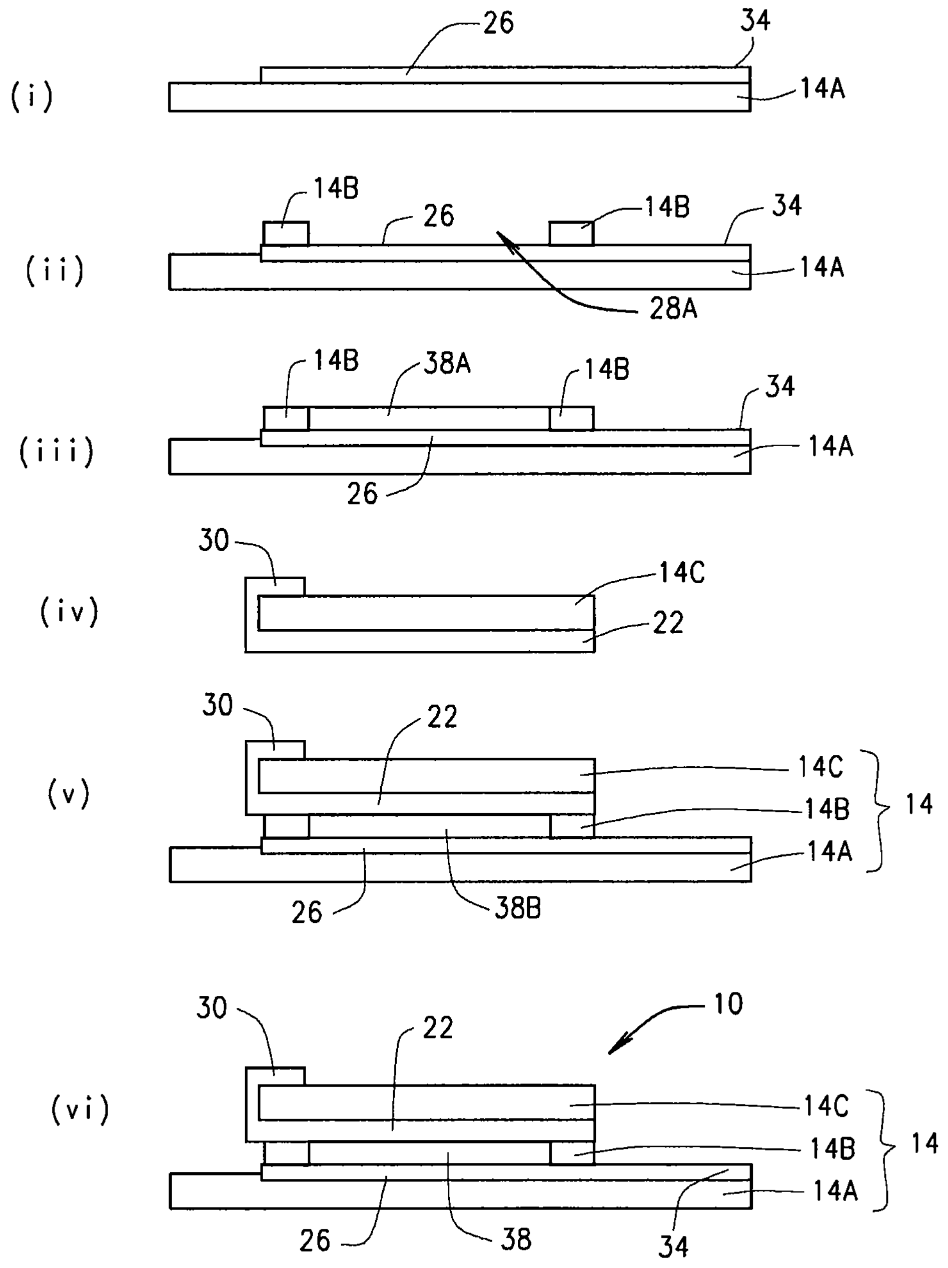
FIG. 2B is a sequence diagram of the exemplary fabrication process illustrated in FIG. 2A, in accordance with various embodiments of the present disclosure.

Referring now to FIGS. 2A and 2B, FIG. 2A provides a flow diagram 200 illustrating an exemplary fabrication process of the high energy-density micro radioisotope power source device 10 and FIG. 2B provides a sequence diagram of the exemplary process illustrated in FIG. 2A. In various embodiments, to fabricate the micro power generator device 10, a bottom electrode is deposited on a bottom dielectric and radiation shielding substrate 14A, e.g., a glass substrate, in a sputtering system and patterned with a standard photolithography process to provide the rectifying contact layer 26, as indicated at 202 in FIG. 2A and (i) in FIG. 2B. Alternatively, the bottom electrode could provide the ohmic contact layer 22.

Then, a dielectric and radiation shielding material 14B is deposited onto the substrate 14A around the rectifying contact layer and over the Schottkey lead 34 to provide a bottom portion 28A of the micro chamber 28, as indicated at 204 in FIG. 2A and (ii) in FIG. 2B. Prior to, concurrent with, or subsequent to deposition of the rectifying contact layer 26 (or the ohmic contact layer 22, whichever is deposited first) and/or the deposition of the dielectric and radiation shielding material 14B, the semiconductor material, e.g., Se, is combined with the radioisotope material, e.g., $^{35}S$, and in various embodiments, the dopant, e.g., phosphorous, to provide a pre-voltaic semiconductor composition 38A, as indicated at 206 in FIG. 2A. The semiconductor, radioisotope and dopant materials can be provided in any form that allows the materials to be combined and disposed within the micro chamber 28, as described below. For example, in various embodiments, the semiconductor, radioisotope and dopant materials are provided in micro powder or granular form. Alternatively, one or more of the materials can be dissolved within a solvent, e.g., a high vapor pressure such as toluene (21.86 mmHg), ethanol (43.89 mmHg) or carbon-disulfide (300 mmHg) to enhance the mixing of the materials.

Subsequently, the pre-voltaic semiconductor composition 38A is disposed into the bottom portion micro chamber 28, as indicated at 208 in FIG. 2A and (iii) in FIG. 2B. Next, a top electrode is deposited on a top dielectric and radiation shielding substrate 14C, e.g., a glass substrate, in a sputtering system and patterned with a standard photolithography process to provide the ohmic contact layer 22, as indicated at 210 in FIG. 2A and (iv) in FIG. 2B. Alternatively, the top electrode can provide the rectifying contact layer 26 in embodiments where the first electrode comprises the ohmic contact layer 22.

Then, the top dielectric and radiation shielding substrate 14C with the ohmic contact layer 22 is placed over the bottom portion of the micro chamber 25 filled with the pre-voltaic semiconductor composition 38A, and in contact with the dielectric and radiation shielding material 14, as indicated at 212 in FIG. 2A. Next, the bottom substrate 14A, the dielectric and radiation shielding material 14B, the top substrate 14C, and pre-voltaic semiconductor composition 38A are heated to a temperature at which the pre-voltaic semiconductor composition 38A will liquefy, e.g., 275° C. for a pre-voltaic semiconductor composition including Se mixed with $^{35}S$, thereby thoroughly mixing and integrating the semiconductor material with the radioisotope material and the dopant (if employed) in a liquid state composite mixture 38B, as indicated at 214 in FIG. 2A and (v) in FIG. 2B. Hence, a very uniformly mixed liquid state composite mixture 38 is provided by heating the pre-voltaic semiconductor mixture 38A to liquid state.

While the bottom substrate 14A, the dielectric and radiation shielding material 14B, the top substrate 14C, and the liquefied composite mixture 38B are being heated, a thermo compression bonding process is applied to bond the top substrate 14C to the dielectric and radiation shielding material 14B, thereby forming the body 14 (comprised of the bonded together bottom substrate 14A, dielectric and radiation shielding material 14B, and top substrate 14C), as indicated at 216 in FIG. 2A and (v) in FIG. 2B. Particularly, the thermo compression bonding process provides a 'leak-proof' seal between the bottom substrate 14A, the dielectric and radiation shielding material 14B, and the top substrate 14C. Alternatively, the top substrate 14C can be bonded to the dielectric and radiation shielding material 14B using any other bonding process suitable to provide a 'leak-proof' seal between the bottom substrate 14A, the dielectric and radiation shielding material 14B, and the top substrate 14C. For example, in various embodiments, the bonding process can include anodic bonding, eutectic bonding, fusion bonding, polymer bonding, or any other suitable bonding method.

Next, the sealed body 14 and liquefied mixture are allowed to cool such that the liquefied mixture solidifies to form the solid-state voltaic semiconductor 38, thereby providing the micro radioisotope power source device 10, as indicated at 218 in FIG. 2A and (vi) in FIG. 2B.

Figure 3B:
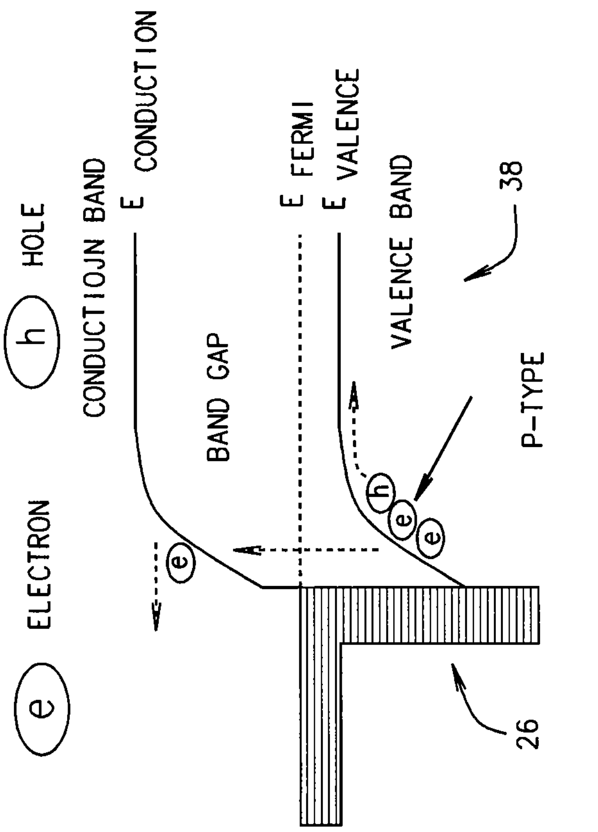
FIG. 3B is an exemplary band diagram illustrating the mobile electron-hole pair generation within a semiconductor material of the micro radioisotope power source device shown in FIGS. 1A and 1B, in accordance with various embodiments of the present disclosure.
Figure 3A:
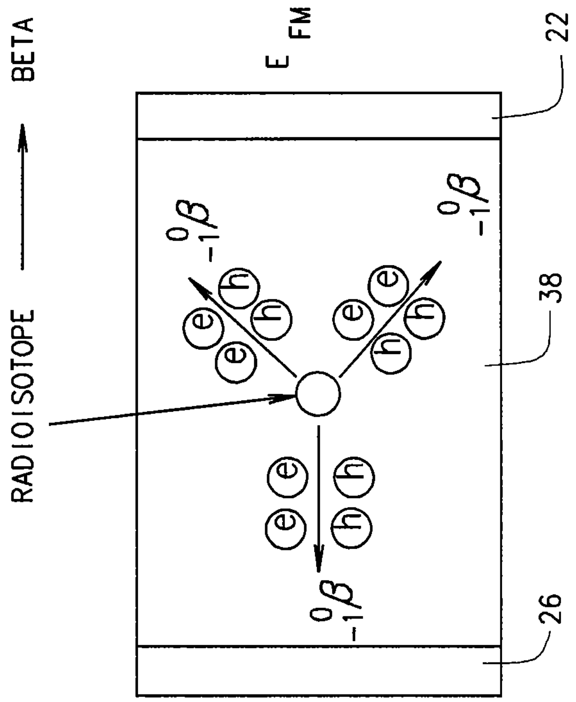
FIG. 3A is an exemplary topological schematic of the micro radioisotope power source device shown in FIGS. 1A and 1B illustrating the mobile electron-hole pair generation within a semiconductor material of the radioisotope micro power source, in accordance with various embodiments of the present disclosure.

Referring now to FIGS. 3A and 3B, the mobile electron-hole pair generation in the solid-state voltaic semiconductor 38 encapsulated within the device micro chamber 28 is exemplarily illustrated in FIGS. 3A and 3B. In the solid-state voltaic semiconductor 38, electrons are initially located in the valence band and are covalently bound to neighboring atoms. Once the electrons are excited by the absorption of the ionizing radiation from radioactive decay of the radioisotope, the electrons move from the valence band to the conduction band and leave unoccupied states (holes) in the valence band. Then, another electron from neighboring atom will move to fill the resulting hole. The overall effect of the absorption of the ionizing radiation energy in the solid-state voltaic semiconductor 38 is the creation of a large number of mobile electron-hole pairs. Moreover, with the encapsulation method, radiation directional losses can be minimized due to the ability of Beta particles to travel in random directions within the semiconductor. Hence, all the energy can contribute to generate electron hole pairs.

When the rectifying contact layer 26, having work function $q\Phi_m$, contacts the solid-state voltaic semiconductor 38, having a work function $q\Phi_s$, charge transfer occurs until the Fermi levels align at equilibrium. When $\Phi_m > \Phi_s$, the solid-state voltaic semiconductor 38 Fermi level is initially higher than that of the rectifying contact layer 26 before contact is made. At the junction of the rectifying contact layer 26 and solid-state voltaic semiconductor 38, an electric field is generated in the depletion region. When the ionizing radiation deposits energy throughout the depletion region near the junction of the rectifying contact layer 26 and solid-state voltaic semiconductor 38, the electric field will separate the electron-hole pairs in different directions (electrons toward the semiconductor 38 and holes toward the rectifying contact layer 26). This results in a potential difference between the rectifying and ohmic contact layers 26 and 22.

It is envisioned that the contact area between the solid-state voltaic semiconductor 38, and the ohmic and rectifying contact layers 22 and 26 can be increased to increase the conversion efficiency, i.e., increase the creation of electron-hole pairs (EHP).

Figure 4A:
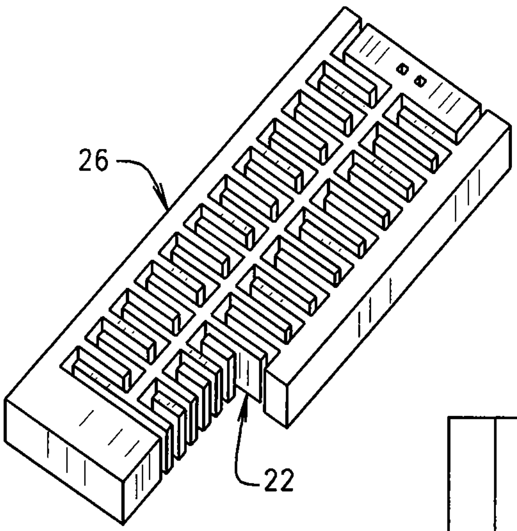
FIG. 4A is an isometric view of an ohmic contact layer and a rectifying contact layer, of the high energy-density micro radioisotope power source device shown in FIG. 1, having a comb-finger configuration, in accordance with various embodiments of the present disclosure.
Figure 4B:
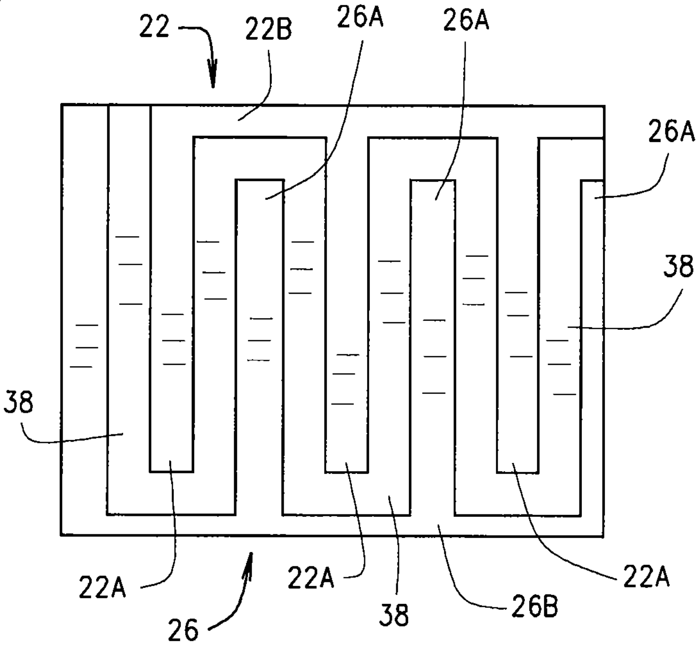
FIG. 4B is a partial top of the ohmic contact layer and a rectifying contact layer shown in FIG. 4A, in accordance with various embodiments of the present disclosure.

For example, referring to FIGS. 4A and 4B, in various embodiments, the ohmic contact layer 22 and the rectifying contact layer 26 can be structured to provide a 'comb-finger' type of electrode structure that will allow the total contact surface between the solid-state voltaic semiconductor 38 and the ohmic and rectifying contact layers 22 and 26 to be enlarged without increasing the size of the micro power source device 10. The ohmic contact layer comb type fingers 22A extending from an ohmic contact base 22B, interposed with the rectifying contact layer comb like fingers 26A extending from a rectifying contact base 26B, as illustrated in FIGS. 4A and 4B, increase the surface per volume ratio of the solid-state voltaic semiconductor 38 to the ohmic and rectifying contact layers 22 and 26, resulting in higher conversion efficiency.

The thickness of the ohmic and rectifying contact layer fingers 22A and 26A can be adjusted to increase the efficiency of the micro power source device 10. Beta particles can penetrate the thin metal structures and contribute EHP generation within solid-state voltaic semiconductor 38 disposed between the ohmic and rectifying contact layer fingers 22A and 26A.

Figure 5:
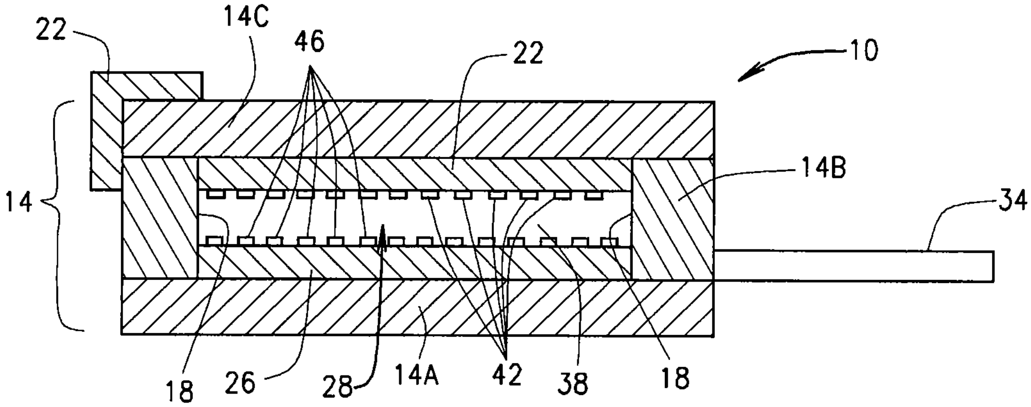
FIG. 5 is a cross-section view of the high energy-density micro radioisotope power source device, shown in FIG. 1A, having an ohmic contact layer and a rectifying contact layer that each include nanostructures, in accordance with various embodiments of the present disclosure.

Referring now to FIG. 5, as another example of increased total contact surface between the solid-state voltaic semiconductor 38 and the ohmic and rectifying contact layers 22 and 26, in various embodiments, the ohmic contact layer 22 and/or the rectifying contact layer 26 can include nanostructures, or nanopillars, 42 and/or 46, respectively, formed along their respective interior surfaces. More particularly, the nanostructures 42 and/or 46 are formed on the interior surfaces of the respective ohmic and/or rectifying contact layers 22 and/or 26 at the interface between the solid-state voltaic semiconductor 38 and the respective ohmic and/or rectifying contact layers 22 and 26. The nanostructures 42 and/or 46 increase the surface per volume ratio of the solid-state voltaic semiconductor 38 to the ohmic and/or rectifying contact layers 22 and/or 26, resulting in higher conversion efficiency.

In various implementations, the nanostructures 42 and/or 46 can be grown, deposited or formed on the interior surfaces of the respective ohmic and/or rectifying contact layers 22 and/or 26 using a porous alumina oxide (PAO) template. The PAO template can be controlled to form any desirable size nanostructures. For example, the PAO template can be utilized to grow, deposit or form, the nanostructures 42 and/or 46 having diameters between 100 nm and 400 nm with heights between 15 μm and 30 μm. Alternatively, the nanostructures 42 and/or 46 can be grown, deposited or formed on the interior surfaces of the respective ohmic and/or rectifying contact layers 22 and/or 26 by electroplating a suitable metal, such as Ni, Au, Cu, Pd, Al, Ag, and Co, through a seed layer.

An exemplary method of growing, depositing or forming the nanostructures 42 and/or 46 on the interior surfaces of the respective ohmic and/or rectifying contact layers 22 and 26 can be as follow. First, the rectifying contact layer 26 can be deposited on the glass substrate 14A by sputtering, e.g., a 0.5 μm thick layer of nickel. Then a second metal layer can be deposited on top of the bottom electrode, e.g., a 0.2 μm thick layer of aluminum. Next, the second layer is anodized with oxalic acid to create porous membranes, e.g., porous aluminum membranes. Then, the same metal as that used for the rectifying contact layer 26, e.g., nickel, is deposited through the porous membranes by electroplating. In various implementations, the electrolyte can comprise $NiSO_4.6H_2O$ of 15 g/L, $H_3BO_3$ of 35 g/L, and Di water with 0.3-0.6 mA/cm$^2$. Subsequently, the porous membranes, e.g., the aluminum porous membranes, are removed by an aqueous solution, e.g., NaOH, thereby providing the nanostructures 46 on the rectifying contact layer 26. The nanostructures 42 can be grown, deposited or formed on the ohmic contact layer 22 in a substantially similar manner.

Example 1

An exemplary high energy-density micro radioisotope power source device 10 was constructed as described herein and tested. The test procedure and results are as follows.

In this example, selenium (Se) was used as the semiconductor materials and Sulfur-35 ($^{35}S$) was used as the radioisotope material. Sulfur-35 was used for two main reasons. Firstly, $^{35}S$ is a pure beta emitter source with maximum decay energy of 0.167 MeV, an average beta decay energy of 49 keV and a half-life of 87.3 days. The range of the 49 keV beta is less than 50 microns in selenium which is ideal for depositing all of the decay energy in the voltaic semiconductor 38. Secondly, $^{35}S$ is chemically compatible with selenium. Selenium has semiconducting properties in both the solid (amorphous) and liquid state. The chemical bond model of amorphous selenium is categorized to be lone pair semiconductors (two-fold coordination) because the electron configuration is [Ar] $3d^{10}4S^24p^4$, which implies that the properties of Se are primarily influenced by the two non-bonding p-orbitals of group 16 chalcogen, which exhibited in covalent interaction bonding. Se atoms tend to bond in lone pairs within the semiconductor in either helical chain (trigonal phase) formation or $Se_8$ ring (monoclinic phase) formation. Once Se melts ($T_m$=221° C.), the structure of the liquid phase Se is mostly a planar chain polymer with the average of $10^4$~$10^6$ atoms per chain near $T_m$, and a small fraction of $Se_8$ ring.[18]

The liquefied composite mixture 38B naturally wets the surface of the electrodes, i.e., the ohmic and rectifying contact layers 22 and 26, very well and enhances the electrical contact by reducing contact resistance at both the rectifying and ohmic contacts. In addition, the melting point of the pre-voltaic semiconductor mixture 38A can be lower than the original melting temperatures of the individual materials by employing an eutectic mixture.

Figure 6:
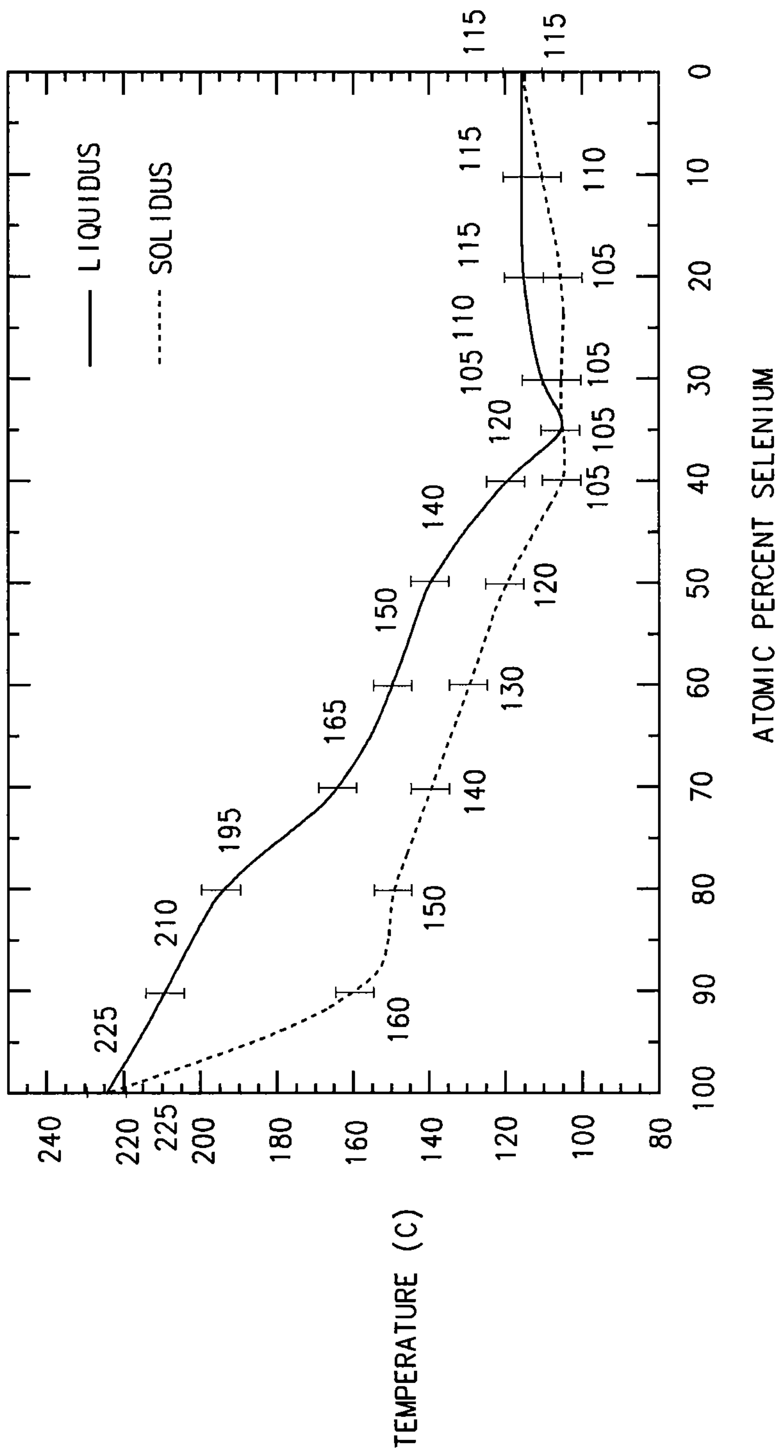
FIG. 6 is binary phase diagram for different material compositions of an exemplary voltaic semiconductor used in the high energy-density micro radioisotope power source device, shown in FIG. 1, in accordance with various embodiments of the present disclosure.

First, the heterogeneous equilibrium between solid and liquid phases of a two-component selenium-sulfur system was investigated. A binary phase diagram shown in FIG. 6 was constructed for the mixture at different overall compositions. From the experimentally obtained phase diagram, it can be seen that the two liquidus curves intersect at the eutectic point. The eutectic temperature and composition of the binary $Se_xS_y$ semiconductor were measured at 105° C. and $Se_{65}S_{35}$, respectively.

Different metals were used to form a rectifying junction, e.g., a Schottky junction, and an ohmic junction. The characteristics of a semiconductor diode can be determined by the barriers at metal-semiconductor junctions due to the different work functions. High work function metal such as nickel (5.1-5.2 eV) or gold (5.1-5.4 eV) can be used as an ohmic contact, which results in easy hole flow across the junction. For rectifying behavior for p-type semiconductor (amorphous selenium), aluminum with a low work function ($\Phi_m$) of 4.1-4.3 eV can be used. FIG. 2B can be used to illustrate the band structure of the rectifying junction at equilibrium. For example, a band gap energy ($E_g$) of selenium is 1.77 eV, electron affinity of selenium ($\chi_s$) is 3.3 eV and work function ($\phi_s$) of selenium is 4.92 eV. When a metal with low work function $q\Phi_m$ contacts a p-type semiconductor with work function $q\Phi_s$, charge transfer occurs until the Fermi levels on each side are aligned at equilibrium. It forms a rectifying, or Schottky, barrier at the metal-semiconductor contact and an electric field is generated in the depletion region. Once the ionizing radiation deposits energy throughout the depletion region near the metal-semiconductor junctions, the electric field will separate the EHPs in opposite directions at the rectifying contact. This results in a potential difference between the two electrodes, i.e., between the ohmic and rectifying contact layers 22 and 26.

In the present example, the composited selenium-sulfur was placed inside the 20 μm thick of SU8 polymer reservoir with 1 $cm^2$ active area and sandwiched by two electrodes, i.e., between the ohmic and rectifying contact layers 22 and 26. A 0.3 μm-thick aluminum layer was deposited on the bottom glass substrate 14A to provide a rectifying, or Schottky, contact electrode and a 0.3 μm-thick nickel was deposited on the top glass substrate 14C to provide an ohmic contact electrode. The mixed selenium-sulfur $Se^{35}S$ was deposited in the bottom portion 28A of the micro chamber 28 and the top substrate 14C with the rectifying contact electrode disposed thereon, was placed on top. The device was rapidly heated to 275° C. followed by thermo compression bonding to create a leak-tight package. The I-V characteristic curves were measured by the Semiconductor Parameter Analyzer (Keithley 2400) with current measure resolution of 1 fA ($10^{-15}$ A).

Figure 7:
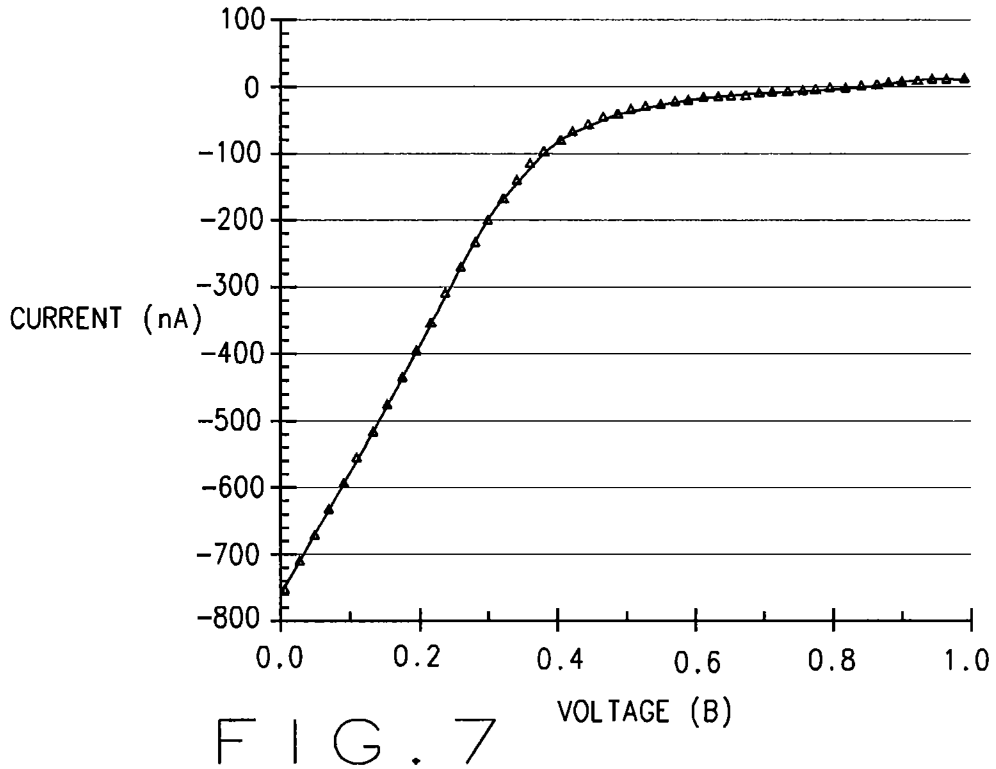
FIG. 7 is an illustration of an exemplary I-V curve illustrating dark current data produced by the high energy-density micro radioisotope power source device, shown in FIG. 1, at 22° C., in accordance with various embodiments of the present disclosure.

FIG. 7 shows the dark current data generated by the micro radioisotope power source device 10 at room temperature. Particularly, at room temperature, a short circuit current ($I_{SC}$) of 752 nA and the open circuit voltage ($V_{OC}$) of 864 mV were observed.

Figure 8:
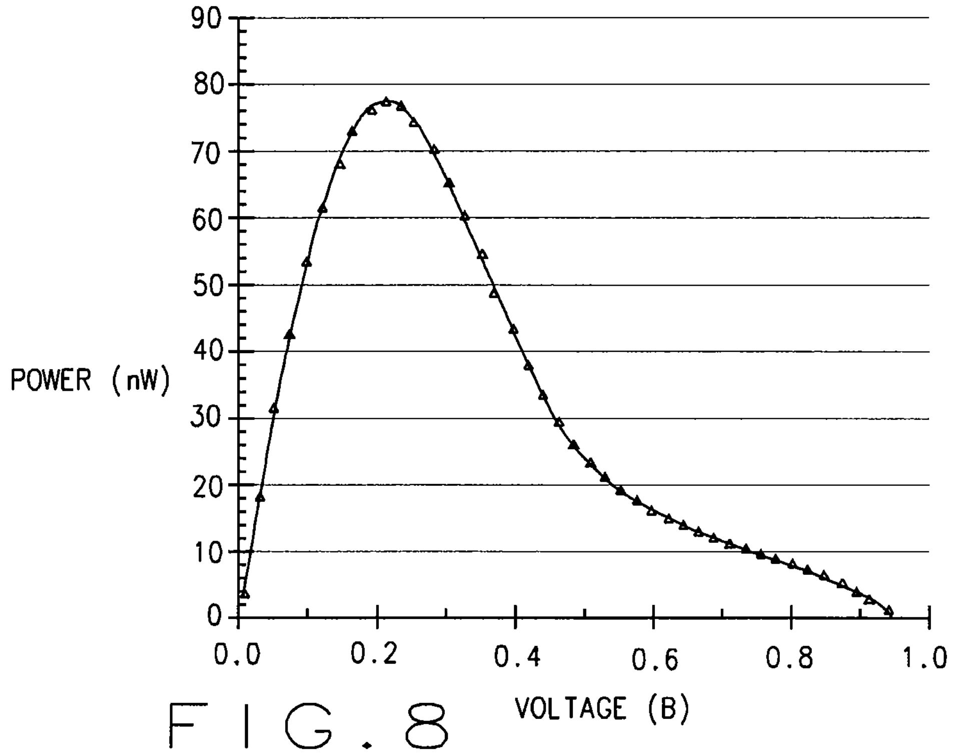
FIG. 8 is an illustration of an exemplary P-V showing the output power bias voltage produced by the high energy-density micro radioisotope power source device, shown in FIG. 1, in accordance with various embodiments of the present disclosure.

FIG. 8 shows the output power against bias voltage of the micro radioisotope power source device 10 at room temperature. Particularly, at room temperature, a maximum power of 76.53 nW was obtained at 193 mV. The overall efficiency conversion of encapsulated betavoltaic, i.e., solid-state composite voltaic semiconductor 38, with $^{35}S$ (402 MBq) was observed to be 2.42%. This result is much higher than known conventional radioisotope microbatteries as shown in FIG. 9, which compares and summarizes many known betavoltaic technologies with respect to exemplary test data results of produced by the high energy-density micro radioisotope power source device 10. Most such known betavoltaics have a disadvantage of bulky shielding structures resulting in low power density. To compare the power density, each device's output power is normalized to 10 Ci of its radioactivity. Results yielded by the high energy-density micro radioisotope power source device 10 shows a power density that is roughly twice as large as that of the conventional device Betacel model 50. Thus, it is believed that, with the proper radioisotope material selection, a higher total power density of nearly 36.41 $\mu W/cm^3$ can be achieved utilizing the encapsulated solid-state composite voltaic semiconductor 38 design of the high energy-density micro radioisotope power source device 10, as described herein.

Figure 10:
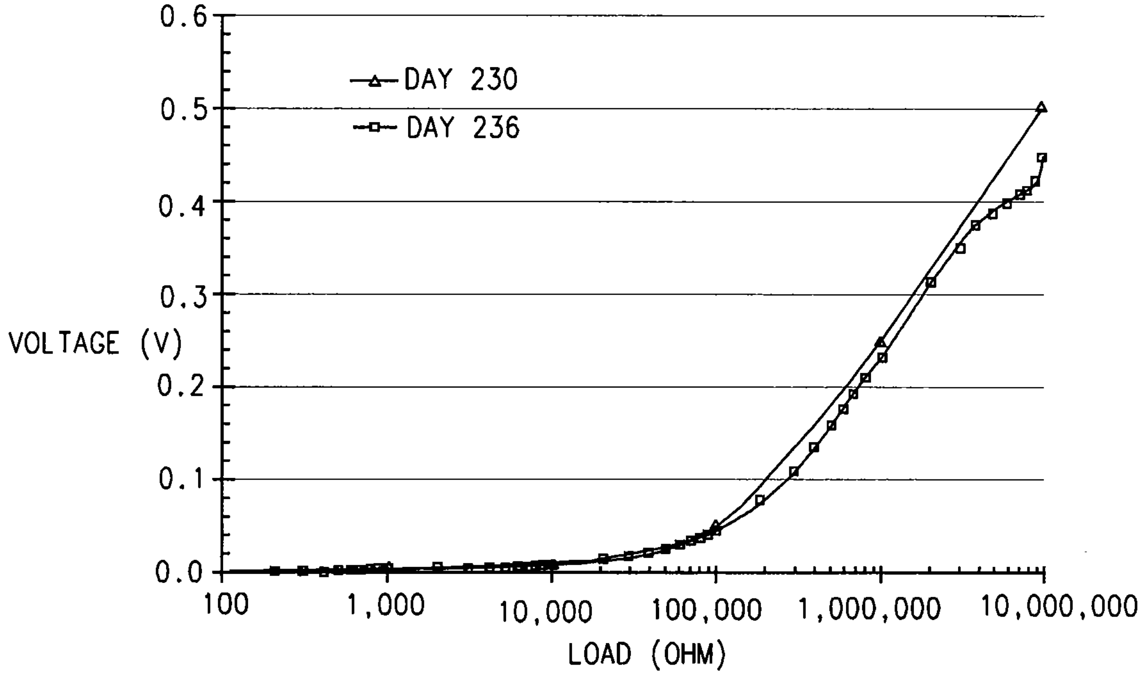
FIG. 10 is an exemplary illustration showing output voltages of the micro radioisotope power source device, shown in FIG. 1, with respect to various applied loads, in accordance with various embodiments of the present disclosure.
Figure 11:
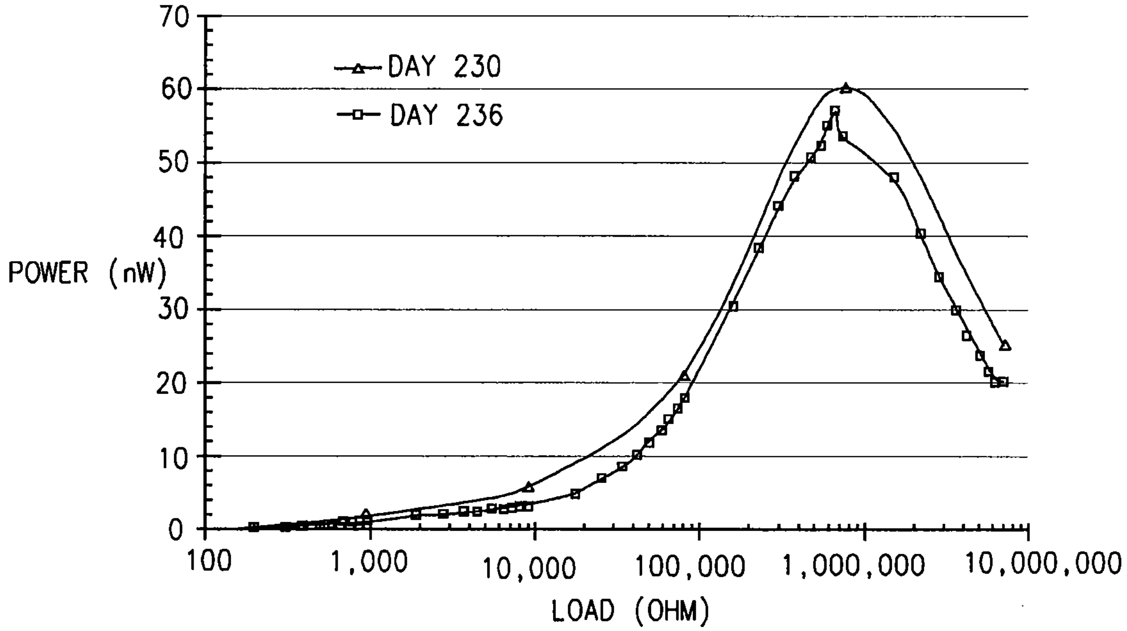
FIG. 11 is an exemplary illustration showing power outputs of the micro radioisotope power source device, shown in FIG. 1, with respect to various applied loads, in accordance with various embodiments of the present disclosure.

Referring now to FIGS. 10 and 11, to observe the functionality of the micro radioisotope power source device 10 under load conditions and characterize the output voltage of the device 10, a wide range of load resistances were connected to micro radioisotope power source device 10. FIGS. 10 and 11 show the output voltages and output power with respect to the various load resistances (100Ω~10MΩ). As shown, the output voltage gradually increases with the increased load, and the maximum output voltage generated was observed to 0.499V (day 230), and 0.4555V (day 236) with a 1MΩ resistor. Additionally, the output power was maximized at approximately 1MΩ. As also shown, the maximum power was 59.59 nW (efficiency, n=2.56%) on day 230 and was still very high around 56.38 nW (n=2.54%) on day 236.

Figure 12:
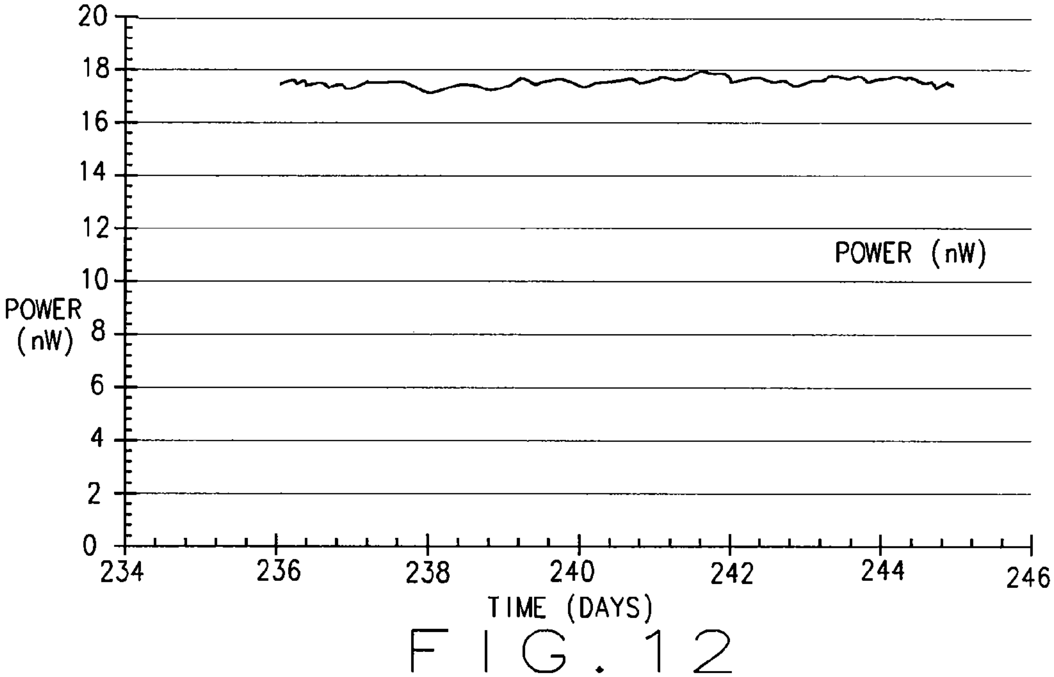
FIG. 12 is an exemplary illustration showing the power output of the micro radioisotope power source device, shown in FIG. 1, over a period of nine days, in accordance with various embodiments of the present disclosure.

Referring now to FIG. 12, furthermore, a very large resistive load (10MΩ) was connected to the micro radioisotope power source device 10 in order to characterized the power drain. Over a 9 day period the output voltage was continuously measured and recorded. As shown in FIG. 12, over the 9 day period the output power was never fully drained and the average output power was 17.5 nW (±2.5%).

Figure 13:
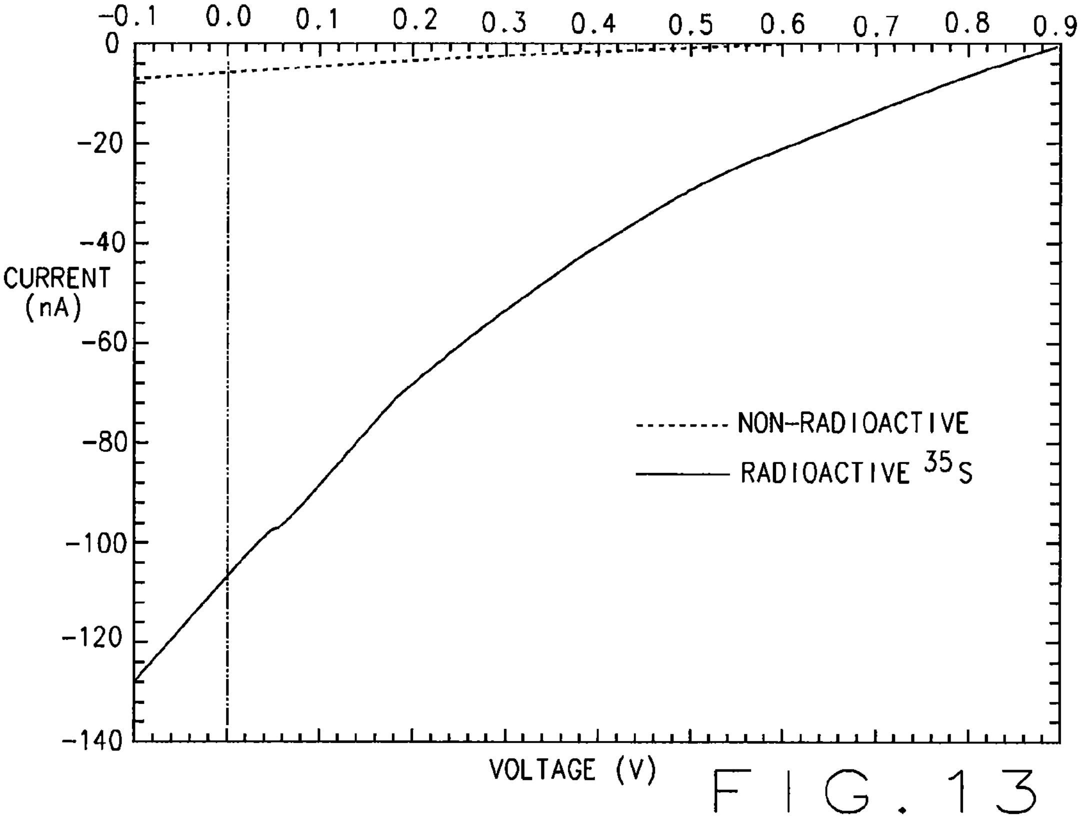
FIG. 13 is an illustration of an exemplary I-V characteristics of the micro radioisotope power source device, shown in FIG. 1, with non-radioactive sulfur and radioactive sulfur at 140° C., in accordance with various embodiments of the present disclosure.

FIG. 13 illustrates the exemplary I-V characteristics of the micro radioisotope power source device 10 with non-radioactive sulfur and radioactive sulfur at 140° C. As shown, the micro radioisotope power source device 10 with non-radioactive sulfur yields an open-circuit voltage ($V_{OC}$) of 561 mV, which is much higher than the voltage level that can be obtained from the thermoelectric effect since the Seebeck coefficient of pure selenium is only about 1.01 mV/° C. at 140° C. The open-circuit voltage increased as the temperature increased due to the growth of diffusion and tunneling at the depletion region and the reduction of contact resistance by liquid phase contact.

Additionally, the dark current was observed with a short-circuit current ($I_{SC}$) of 0.15 nA. This negative current without external bias could be driven by thermionic emission due to the thermal generation of carriers of liquid semiconductor. As further shown in FIG. 13, with radioactive sulfur $^{35}S$ (166 MBq), a short-circuit current ($I_{SC}$) of 107.4 nA and the open-circuit voltage ($V_{OC}$) of 899 mV were observed. Particularly, the short-circuit current corresponding to the radioisotope radiation is almost three orders of magnitude different from that of the non-radioactive device.

Figure 14:
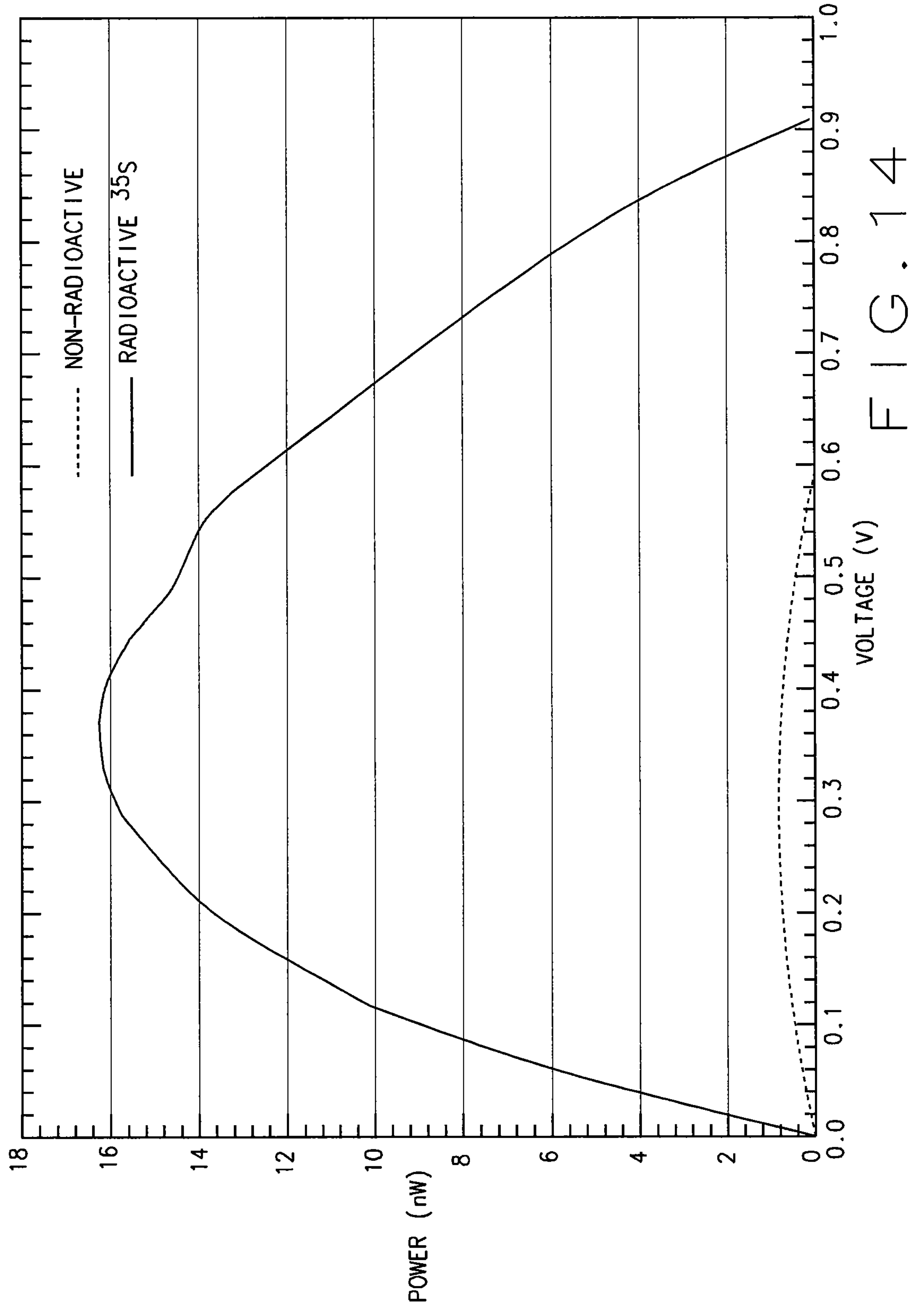
FIG. 14 is an illustration of exemplary output power of the micro radioisotope power source device, shown in FIG. 1, with respect to various bias voltages, in accordance with various embodiments of the present disclosure.

FIG. 14 illustrates the exemplary output power of the micro radioisotope power source device 10 with respect to various bias voltages. As shown, the maximum power of 16.2 nW was obtained at 359.9 mV from the micro radioisotope power source device 10 with radioactive $^{35}S$, and the maximum power solely from the radioactivity is approximately 15.58 nW. The theoretical maximum available power from $^{35}S$ can be found from the average beta energy spectrum and the maximum radioisotope power conversion efficiency of $^{35}S$ (166 MBq) can be calculated as follows:

$$\eta^{35S} = \left(\frac{15.58\cdot 10^{-9}\ \mathrm{W}}{(4.5\cdot 10^{-3}\ \mathrm{ci})(3.7\cdot 10^{10}\ \mathrm{dps})(49\cdot 10^{3}\ \mathrm{eV})(16\cdot 10^{-19}\ \mathrm{C})}\right)\cdot 100\% = 1.194\%.$$

Consequently, a total power efficiency of 1.207% from both beta flux and heat flux was obtained.

Although the micro radioisotope power source device 10 has been exemplarily described herein as including the semiconductor material Selenium (Se) integrated with radioactive source material Sulfur-35 ($^{35}S$), it is envisioned that the micro radioisotope power source device 10 can include other suitable semiconductor materials and/or other suitable chemically compatible radioactive source materials. For example, in various embodiments, the micro radioisotope power source device 10 can include one or more other semiconductor materials, such as Te, Si, etc., and the respective semiconductor material can be integrated with one or more other beta or alpha emitting radionuclides, such as Pm-147 and Ni-63, that decay with essentially no gamma emission.

Additionally, the mixing ratio of the semiconductor material(s), the radioisotope material(s) and dopant(s) can be varied to provide any desired performance of the micro power source device 10 at any selected ambient temperature. Hence, the high energy-density micro radioisotope power source device 10, as described herein, can efficiently operate at a wide range of temperatures, e.g., from approximately 0° C., or less, to 250° C., or greater.

The high energy-density micro radioisotope power source device 10, as described herein, offers the potential to revolutionize the application of MEMS technologies, particularly when the MEMS systems are employed in extreme and/or inaccessible environments. The ability to use MEMS as thermal, magnetic and optical sensors and actuators, as micro chemical analysis systems, and as wireless communication systems in such environments can have a major impact in future technological developments. For example, it could increase public safety by providing an enabling technology for employing imbedded sensor and communication systems in transportation infrastructure (e.g. bridges and roadbeds).

Additionally, some advantages of the high energy-density micro radioisotope power source device 10, as described herein, are (1) energy densities that are $10^4$ to $10^6$ times greater than that available from chemical systems, (2) constant output even at extreme temperatures and pressures, and (3) long lifetimes (with the appropriate choice of isotope). Additionally, the high energy-density micro radioisotope power source device 10, as described herein, overcomes fundamental drawbacks, such as lattice displacement damage, of using alpha emitting isotopes in solid-state conversion devices.

Still further advantages include the elimination of radiation self-absorption losses and losses between the radioisotope and the betavoltaic cell, common in known radioisotope power sources. This is due to the radioactive material and the semiconductor material being mixed together within the micro chamber 28. For the selection of the radioactive source, high beta spectrum energy and high specific activity are two main parameters to be considered. Furthermore, common interaction losses can be reduced by adjusting the thickness of solid-state composite voltaic semiconductor 38. The thickness of solid-state composite voltaic semiconductor 38 has to be thin enough so that the beta radiation can cover whole volume of the solid-state composite voltaic semiconductor 38 encapsulated within the micro chamber 28.

Another advantage is that the encapsulation of the solid-state composite voltaic semiconductor 38 within the micro chamber, as described herein, can provide secure self-shielding and eliminate the need of extra shielding structures. It provides a device that is considerably smaller than the conventional devices, and it is very cost effective because the solid-state composite voltaic semiconductor 38, as described herein, does not contain costly silicon-based materials.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A method of constructing an amorphous solid-state high energy-density micro radioisotope power source device; said method comprising:

directly mixing at least one semiconductor material with at least one radioisotope material to provide a pre-voltaic semiconductor mixture;

subsequently depositing the pre-voltaic semiconductor mixture into a micro chamber formed in a bottom portion of a high energy-density micro radioisotope power source device, the bottom portion of the high energy-density micro radioisotope power source device including a first electrode disposed in a bottom of the micro chamber;

subsequently disposing a top portion of the high energy-density micro radioisotope power source device onto the bottom portion of the high energy-density micro radioisotope power source device, covering the micro chamber, to provide an assembled body of the high energy-density micro radioisotope power source device, the top portion of the high energy-density micro radioisotope power source device including a second electrode disposed at a top of the micro chamber;

subsequently heating the assembled body to a temperature at which the pre-voltaic semiconductor mixture will liquefy within the micro chamber such that atoms of the at least one semiconductor material will chemically bind with atoms of the at least one radioisotope material and provide a liquid state composite; and subsequently cooling the assembled body and liquid state composite such that liquid state composite solidifies to provide a solid-state composite voltaic semiconductor, and thereby providing a solid-state high energy-density micro radioisotope power source device.

2. The method of claim 1, further comprising combining at least one dopant with the at least one semiconductor material with the at least one radioisotope material to provide the pre-voltaic semiconductor mixture.

3. The method of claim 2, wherein heating the assembled body comprises heating the assembled body to a temperature at which the pre-voltaic semiconductor mixture will liquefy such that the at least one semiconductor material, at least one radioisotope material, and at least one dopant are thoroughly and uniformly mixed to provide a liquid state composite.

4. The method of claim 1, further comprising applying a compression bonding process to the assembled body as the assembled body is heated to a temperature at which the pre-voltaic semiconductor mixture will liquefy to form a 'leak-proof' seal between the top and bottom portions of the high energy-density micro radioisotope power source device.

5. The method of claim 1, further comprising providing nanostructures on an interface surface of at least one of the first and second electrodes to increase a surface per volume ratio of the solid-state composite voltaic semiconductor to at least one of the first and second electrodes, resulting in higher conversion efficiency of the solid-state high energy-density micro radioisotope power source device.

6. The method of claim 1, further comprising:

structuring the first electrode to include comb-like fingers extending from a base of the first electrode; and structuring the second electrode to include comb-like fingers extending from a base of the second electrode such that the first electrode comb-like fingers are interposed with the second electrode comb-like fingers and a gap is provided between the interposed first and second electrode comb-like fingers in which the solid-state composite voltaic semiconductor is disposed such that a surface per volume ratio of the solid-state composite voltaic semiconductor to the first and second electrodes is increased, resulting in higher conversion efficiency of the solid-state high energy-density micro radioisotope power source device.

7. The method of claim 1, wherein the solid-state high energy-density micro radioisotope power source device comprising the solidified composite is operational to provide electrical voltage at least at temperatures between 0° C. and 300° C. without altering the material composition of the solidified composite.

8. A method of constructing an amorphous solid-state high energy-density micro radioisotope power source device; said method comprising:

directly mixing at least one semiconductor material with at least one radioisotope material and at least one dopant to provide a pre-voltaic semiconductor mixture;

subsequently depositing the pre-voltaic semiconductor mixture into a micro chamber formed in a bottom portion of a high energy-density micro radioisotope power source device, the bottom portion of the high energy-density micro radioisotope power source device including a first electrode disposed in a bottom of the micro chamber;

subsequently disposing a top portion of the high energy-density micro radioisotope power source device onto the bottom portion of the high energy-density micro radioisotope power source device, covering the micro chamber, to provide an assembled body of the high energy-density micro radioisotope power source device, the top portion of the high energy-density micro radioisotope power source device including a second electrode disposed at a top of the micro chamber;

subsequently heating the assembled body to a temperature at which the pre-voltaic semiconductor mixture will liquefy within the micro chamber such that atoms of the at least one semiconductor material will chemically bind with atoms of the at least one radioisotope material and at least one dopant to provide a liquid state composite;

applying a compression bonding process to the heated assembled body to form a 'leak-proof' seal between the top and bottom portions of the high energy-density micro radioisotope power source device; and subsequently cooling the assembled body and liquid state composite such that liquid state composite solidifies to provide a solid-state composite voltaic semiconductor, and thereby providing a solid-state high energy-density micro radioisotope power source device.

9. The method of claim 8, further comprising providing nanostructures on an interface surface of at least one of the first and second electrodes to increase a surface per volume ratio of the solid-state composite voltaic semiconductor to at least one of the first and second electrodes, resulting in higher conversion efficiency of the solid-state high energy-density micro radioisotope power source device.

10. The method of claim 8, further comprising:

structuring the first electrode to include comb-like fingers extending from a base of the first electrode; and structuring the second electrode to include comb-like fingers extending from a base of the second electrode such that the first electrode comb-like fingers are interposed with the second electrode comb-like fingers and a gap is provided between the interposed first and second electrode comb-like fingers in which the solid-state composite voltaic semiconductor is disposed such that a surface per volume ratio of the solid-state composite voltaic semiconductor to the first and second electrodes is increased, resulting in higher conversion efficiency of the solid-state high energy-density micro radioisotope power source device.

11. The method of claim 8, wherein the solid-state high energy-density micro radioisotope power source device comprising the solidified composite is operational to provide electrical voltage at least at temperatures between 0° C. and 300° C. without altering the material composition of the solidified composite.

* * * * *